United States Patent
Tanimura

(10) Patent No.: US 6,317,373 B1
(45) Date of Patent: Nov. 13, 2001

(54) SEMICONDUCTOR MEMORY DEVICE HAVING A TEST MODE AND SEMICONDUCTOR TESTING METHOD UTILIZING THE SAME

(75) Inventor: Masaaki Tanimura, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/614,610

(22) Filed: Jul. 12, 2000

(30) Foreign Application Priority Data

Jan. 20, 2000 (JP) ................................ 12-011501

(51) Int. Cl.⁷ ........................................ G11C 7/00
(52) U.S. Cl. ................ 365/201; 365/191; 365/230.03
(58) Field of Search ......................... 365/201, 230.03, 365/191, 189.05, 230.01, 189.01

(56) References Cited

U.S. PATENT DOCUMENTS 4,860,259 * 8/1989 Tobita ................................ 365/201
5,270,977 * 12/1993 Iwamoto et al. .................... 365/201
5,673,270 * 9/1997 Tsujimoto ........................... 714/718

FOREIGN PATENT DOCUMENTS 6-295599    10/1994   (JP).

* cited by examiner

Primary Examiner—Hoai V. Ho
(74) Attorney, Agent, or Firm—McDermott, Will & Emery

(57) ABSTRACT

In a DRAM, a first selector selects one bit of data out of four bits of data read from a memory portion, and provides the data to a data output buffer. Data output buffer is controlled by an output enable signal generated from a determination signal and the like, provides to a data input/output terminal the data from first selector when the four bits of data all match, and causes the data input/output terminal to enter the high impedance state when no match occurs. Since a second selector for selecting either one of read data and determination signal is no longer required, the delay of read data caused by the second selector can be eliminated so that a higher access speed can be achieved.

11 Claims, 11 Drawing Sheets

FIG.6
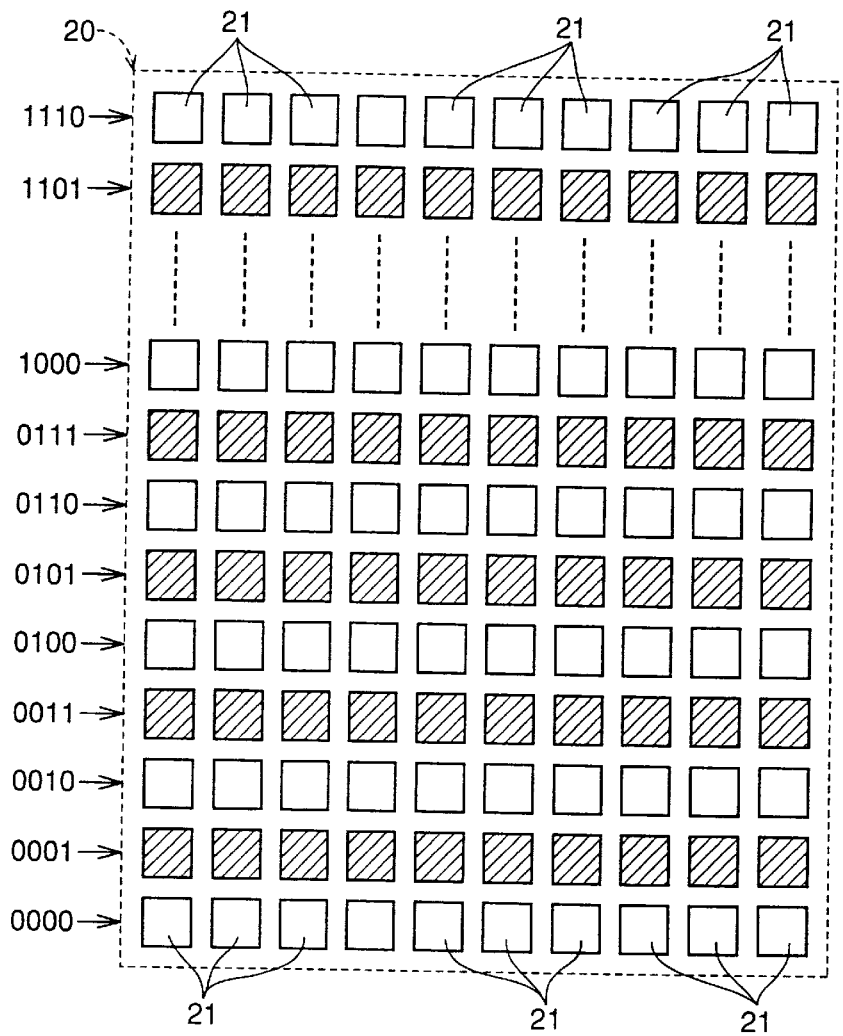
FIG.7A CLK
FIG.7B /RAS
FIG.7C /CAS
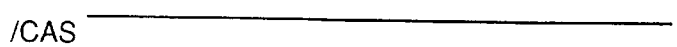
FIG.7D /WE
FIG.7E INPUT DATA
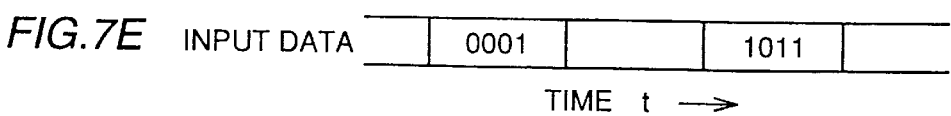
TIME t →

SEMICONDUCTOR MEMORY DEVICE HAVING A TEST MODE AND SEMICONDUCTOR TESTING METHOD UTILIZING THE SAME

BACKGROUND OF THE INVENTION

1. Field of the Invention

The present invention relates to a semiconductor memory device and a semiconductor testing method, and more specifically to a semiconductor memory device having a test mode and a semiconductor testing method utilizing the same.

2. Description of the Background Art

FIG. 9 is a circuit block diagram representing the arrangement of a conventional dynamic random access memory (hereinafter referred to as a DRAM) 30. Such a DRAM 30 is disclosed, for instance, in Japanese Patent Laying-Open No. 6-295599.

In FIG. 9, DRAM 30 is provided with an address buffer circuit 31, a control signal generating circuit 32, a memory portion 33, selectors 34 and 40, a data input buffer 35, a comparison data register 36, a determination circuit 37, a gate circuit 38, a determination result register 39, and a data output buffer 41.

Address buffer circuit 31 generates row address signals RA0 to RAn, column address signals CA0 to CAn, and block selecting signals B0 and B1 based on external address signals A0 to An (n is an integer greater than or equal to 0). Address signals RA0 to RAn and CA0 to CAn are provided to memory portion 33, and block selecting signals B0 and B1 are provided to selector 34. Control signal generating circuit 32 operates in synchronism with an external clock signal CLK, generates a variety of internal control signals according to external control signals /RAS, /CAS, /WE, /OE, and /CS, and controls the entire DRAM 30.

Memory portion 33 includes four memory blocks 33a to 33d, and stores one bit of data or four bits of data from selector 34 during a write operation, and reads four bits of data and provides the data to selector 34 and determination circuit 37 during a read operation.

Memory block 33a includes a memory array 42, a sense amplifier+input/output control circuit 43, a row decoder 47, and a column decoder 48, as shown in FIG. 10. Memory array 42 includes a plurality of memory cells MC arranged in a matrix of rows and columns, a word line WL provided corresponding to each row, and a bit line pair BL and /BL provided corresponding to each column. Each memory cell MC is of the well known type which includes an accessing N-channel MOS transistor and a capacitor for storing information.

Sense amplifier+input/output control circuit 43 includes a data input/output line pair IO and /IO, a column select line CSL provided corresponding to each column, a column select gate 44, a sense amplifier 45, and an equalizer 46. Column select gate 44 includes a pair of N-channel MOS transistors connected between bit line pair BL and /BL and data input/output line pair IO and /IO. Each N-channel MOS transistor has a gate connected to column decoder 48 via column select line CSL. When column decoder 48 raises column select line CSL to the logic high or "H" level or the selected level, a pair of N-channel MOS transistors are rendered conductive, coupling bit line pair BL and /BL to data input/output line pair IO and /IO.

Sense amplifier 45 amplifies the small potential difference between bit line pair BL and /BL to a power-supply voltage VCC according to sense amplifier activating signals SON and ZSOP respectively attaining the "H" level and the logic low or the "L" level. Equalizer 46 equalizes the potentials of bit line pair BL and /BL to a bit line potential VBL (=VCC/2) according to a bit line equalizing signal BLEQ attaining the active level or the "H" level.

Now, the operation of memory block 33a shown in FIG. 10 will be described. During a write operation, column decoder 48 raises to the selected level or the "H" level column select line CSL of the column corresponding to column address signals CA0 to CAn, and column select gate 44 corresponding to this column select line CSL is rendered conductive.

Thus, the write data from selector 34 is provided to bit line pair BL and /BL of the selected column via data input/output line pair IO and /IO. The write data is provided as a potential difference between bit lines BL and /BL. Then, row decoder 47 raises to the selected level or the "H" level word line WL of the row corresponding to row address signals RA0 to RAn, and an N-channel MOS transistor of a memory cell MC in the row is rendered conductive. The capacitor of a selected memory cell MC stores the charge of an amount corresponding to the potential of bit line BL or /BL.

During the read operation, first, bit line equalizing signal BLEQ falls to the "L" level, and the equalization of bit lines BL and /BL is interrupted. Then, row decoder 47 raises to the selected level or the "H" level word line WL of the row corresponding to row address signals RA0 to RAn. The potentials of bit lines BL and /BL slightly change according to the amount of charge of the capacitor in the activated memory cell MC.

Then, sense amplifier activating signals SON and ZSOP respectively attain the "H" level and the "L" level, activating sense amplifier 45. When the potential of bit line BL is slightly higher than the potential of bit line /BL, the potential of bit line BL is pulled up to the "H" level, and the potential of bit line /BL is pulled down to the "L" level. Conversely, when the potential of bit line /BL is slightly higher than the potential of bit line BL, the potential of bit line /BL is pulled up to the "H" level, and the potential of bit line BL is pulled down to the "L" level.

Then, row decoder 48 raises to the selected level or the "H" level column select line CSL of the column corresponding to column address signals CA0 to CAn, rendering column select gate 44 of the column conductive. Data on bit line pair BL and /BL of the selected column is provided to selector 34 via column select gate 44 and data input/output line pair IO and /IO. The arrangement and the operation of other memory blocks 33b to 33d are the same as memory blocks 33a.

Referring back to FIG. 9, selector 34 provides write data DI to each of four memory blocks 33a to 33d when a test signal TE10 is at the active level or the "H" level. Selector 34 selects one of four memory blocks 33a to 33d according to block selecting signals B0 and B1 when test signal TE10 is at the inactive level or the "L" level, and provides read data DO from the selected memory block to selector 40 during a read operation, and provides write data DI to the selected memory block during a write operation. Test signal TE10 attains the active level or the "H" level during a test, and attains the inactive level or the "L" level during a normal operation. Data input buffer 35 transmits to selector 34 write data DI provided via a data input/output terminal T0 from outside, according to a write enable signal ZWE attaining the active level or the "L" level.

Comparison data register 36 latches comparison data DC provided from outside via data input/output terminal T0 and provides comparison data DC to determination circuit 37 according to a latch signal LDC attaining the active level or the "H" level. Determination circuit 37 causes a determination signal JD to attain the "H" level when four bits of data read out from memory portion 33 and comparison data DC all match, and causes determination signal JD to attain the "L" level when they do not match.

Gate circuit 38 inverts determination signal JD generated by determination circuit 37 and provides the inverted signal to a set terminal S of determination result register 39 according to a gate signal GT attaining the active level or the "H" level. When gate signal GT is at the active level or the "H" level, determination circuit 37 and gate circuit 38 are represented by one 5-input EX-OR gate 49, as shown in FIG. 11.

Determination result register 39 causes a determination signal JDO to attain the "L" level according to a reset signal RST attaining the active level or the "H" level, and causes determination signal JDO to attain the "H" level according to an output signal from gate circuit 38 attaining the "H" level. Determination result register 39 is formed by a flip-flop including two gate circuits 39a and 39b, as shown in FIG. 11.

Selector 40 includes a gate circuit 50, an AND gate 51, and an OR gate 52, as shown in FIG. 12. When test signal TE10 is at the active level or the "H" level, output signal JDO from register 39 passes through AND gate 51 and OR gate 52, and when test signal TE10 is at the inactive level or the "L" level, read data DO from selector 34 passes through gate circuit 50 and OR gate 52. Data output buffer 41 transmits to the outside data signal DO and signal JDO from selector 40 via data input/output terminal T0 according to an output enable signal ZOE attaining the active level or the "L" level. Moreover, the portion of DRAM 30 shown in FIG. 9 excluding address buffer circuit 31 and control signal generating circuit 32, i.e., the portion enclosed by the dotted lines, is provided in plurality (for instance, four).

Now, the operation of DRAM 30 shown in FIGS. 9 to 12 will be described. During a normal write operation, write data DI provided from outside is provided to selector 34 via data input buffer 35. Selector 34 selects one of four memory blocks 33a to 33d, row decoder 47 and column decoder 48 select one memory cell MC of a plurality of memory cells MC belonging to the selected memory block, and write data DI is written into the selected memory cell MC.

During a normal read operation, in each of the four memory blocks 33a to 33d, row decoder 47 and column decoder 48 select one memory cell MC out of a plurality of memory cells MC belonging to the memory block, and the data of the selected memory cell MC is read out. Selector 34 selects one of four bits of read data, and the selected read data DO is output to the outside via selector 40 and data output buffer 41.

As shown in FIG. 13, during a test, a plurality (twelve in the figure) of DRAMs 30 are arranged in a matrix of rows (three rows in the figure) and columns (four columns in the figure) on one burn-in test board 55. Drivers 61a to 61c for inputting of control signals /CS0 to /CS2 are respectively provided to the three rows of DRAMs 30, and drivers 62a to 62d for inputting write data DI0 to DI3 and drivers 63a to 63d for outputting determination signals JDO0 to JDO3 are respectively provided to four columns of DRAMs 30. These drivers 61a to 61c, 62a to 62d, and 63a to 63d are provided within a tester (not shown). In practice, drivers for inputting address signals A0 to An, drivers for inputting control signals /RAS, /CAS, /WE, and /OE, and a driver for inputting a clock signal CLK are commonly provided to all DRAMs 30 on board 55, which are not shown in order to simplify the drawing.

During a write operation in a test, signals /CS0 to /CS2 are all brought to the active level or the "L" level, activating all DRAMs 30 on board 55, while signal TE10 attains the active level or the "H" level. In each DRAM 30, write data DI from the tester is provided to four memory blocks 33a to 33d via data input buffer 35 and selector 34. In each memory block, write data DI from selector 34 is written into memory cell MC of the address designated by address signals A0 to An. Therefore, the same data is written into four memory cells MC at the same time. Every address of each DRAM 30 is successively designated in a prescribed cycle, and data DI of a prescribed logic level is written into each address.

During a read operation in a test, signals /CS0 to /CS2 are all brought to the active level or the "L" level, activating all DRAMs 30 on board 55. First, a latch signal LDC is brought to the active level or the "H" level, while comparison data DC is provided from outside and is latched into comparison data register 36. Comparison data DC has the same logic level as the data to be read from memory cell MC of the address for the next read operation, i.e., the data written into that memory cell MC. Moreover, reset signal RST is brought to the "H" level in a pulsed manner, thereby resetting determination result register 39 and bringing signal JDO to the "L" level. Further, test signal TE10 is brought to the active level or the "H" level.

Then, the address for which a read operation is to be performed is designated by address signals A0 to An, and four bits of data is read out from memory portion 33 in each DRAM 30. When the logic levels of these four bits of data and comparison data DC all match, signal JD attains the "H" level. When they do not match, signal JD attains the "L" level. Thereafter, signal GT attains the active level or the "H" level, and signal JD is inverted and provided to set terminal S of determination result register 39. Output signal JDO from register 39 attains the "L" level when the above five bits of data match, and attains the "H" level when they do not match. Moreover, comparison data DC is introduced in order to prevent the mistake of four memory cells MC being determined as normal when the four bits of data read out from memory portion 33 are all the inverted data of the write data. Then, signals /CS0 to /CS2 are temporarily brought to the inactive level or the "L" level, and all DRAMs 30 on board 55 enter the standby state.

Then, signal /CS0 is first brought to the active level or the "L" level, activating four DRAMs 30 in the first row, and output enable signal ZOE is brought to the active level or the "L" level. Determination signal JDO in each of four DRAMs 30 in the first row is output to the tester via data output buffer 41. At this time, at least one of four memory cells MC of DRAM 30 whose signal JDO is at the "H" level is determined as being defective. Thereafter, signals /CS1 and /CS2 are successively brought to the active level or the "L" level, and determination signals JDO of DRAMs 30 in each row are provided to the tester, whereby memory cells MC of each DRAM 30 are determined as being normal or not. Thus, the normalcy of all memory cells MC of each DRAM 30 is determined, four memory cells MC at a time. A defective memory cell MC is replaced by a spare memory cell (not shown).

Since selector 40 is provided in a conventional DRAM 30, read data DO is delayed by selector 40, resulting in the problem of a slower access speed.

In addition, since comparison data register 36 is provided, the load capacitance of data input/output terminal T0 is made larger, which also leads to a slower access speed.

Moreover, in a conventional testing method, a plurality of DRAMs 30 are mounted on one test board 55, and the data write/read operations for all DRAMs 30 are performed simultaneously. Too large a number of DRAMs 30 causes the temperature of test board 55 to exceed the maximum tolerable value and causes the consumed current during the test to exceed the maximum tolerable value for the tester so that an accurate test cannot be conducted.

SUMMARY OF THE INVENTION

Thus, an object of the present invention is to provide a semiconductor memory device having a high access speed.

In addition, another object of the present invention is to provide a semiconductor memory device that can be tested with accuracy even when a large number of semiconductor memory devices are mounted on one test board, and to provide a semiconductor testing method utilizing such a semiconductor memory device.

According to one aspect, the present invention is provided with N memory arrays, each including a plurality of memory cells; a write/read circuit provided corresponding to each memory array for performing a write/read operation of data of a memory cell designated by an address signal; a selecting circuit for selecting one memory array according to a block selecting signal; a data output buffer for outputting to a data input/output terminal a signal of the level corresponding to the data read from the memory array selected by the selecting circuit during the period in which an output enable signal is input and for causing the data input/output terminal to enter the high impedance state during the period in which the output enable signal is not input; a determination circuit for outputting a signal of a first level when N bits of data read out from N memory arrays match and for outputting a signal of a second level when the N bits of data do not match; a first holding circuit for holding an output signal from the determination circuit; a signal generating circuit for outputting the output enable signal according to an external control signal; and a gate circuit for allowing the output enable signal output from the signal generating circuit to be input into the data output buffer during a normal operation and when the first holding circuit holds the signal of the first level during a test mode, and for inhibiting the output enable signal output from the signal generating circuit from being input into the data output buffer when the first holding circuit holds the signal of the second level during the test mode. In order to test N memory cells of a certain address, the same data is written into each of these memory cells, and then, the data of one of these memory cells is read out. If the read data has the same logic as the write data, these memory cells are normal, whereas if the data cannot be read out due to the data input/output terminal entering the high impedance state, at least one of these memory cells is defective. Thus, the selector for selecting either the read data or the determination signal and the comparison data register for holding the write data are no longer necessary so that a higher access speed can be achieved.

Preferably, the selecting circuit selects one of N memory arrays according to a block selecting signal during a normal operation and during a read operation in a test mode, and selects each of N memory arrays during a write operation in a test mode. In addition, a data input buffer is further provided for transmitting external data to the memory array selected by the selecting circuit in response to a write enable signal. In this case, the same data can be written simultaneously into N memory cells during the test mode.

Preferably, the semiconductor memory device further has a defective address output mode in which an address signal for designating a defective memory cell is output, and is further provided with a second holding circuit for holding a plurality of data signals included in the address signal according to the outputting of the signal of the second level from the determination circuit; and a read circuit for successively reading, one at a time, the plurality of data signals held in the second holding circuit during the defective address output mode. The gate circuit further allows the output enable signal output from the signal generating circuit to be input into a data output buffer when a data signal read by the read circuit has a first logic, and inhibits the output enable signal output from the signal generating circuit from being input into the data output buffer when the data signal read by the read circuit has a second logic. In this case, the address signal designating the defective memory cell can be read out during or after the test.

According to another aspect, the present invention is provided with a first holding circuit for holding a first identification code provided from outside, and a determination circuit for determining whether data signals of multiple digits included in a second identification code provided from outside match data signals of multiple digits included in the first identification code held in the first holding circuit and for activating the semiconductor memory device when a match occurs. Therefore, even when a large number of semiconductor memory devices are mounted on one test board to be tested, only the desired semiconductor memory device can be activated and tested by having a first holding circuit of each semiconductor memory device hold a specific first identification code and by providing the determination circuit of a desired semiconductor memory device with a second identification code identical to the first identification code provided to the semiconductor memory device. As a result, the rise in the temperature of the test board exceeding the maximum tolerable value and the increase in the consumed current during a test exceeding the maximum tolerable value of the power-supply current for a tester due to the number of semiconductor memory devices activated at the same time being too large can be prevented so that the test can be conducted with accuracy.

Preferably, a second holding circuit is further provided for holding a significant digit signal provided from outside and having data signals of multiple digits for designating a significant digit of the second identification code. The determination circuit determines whether a data signal of a significant digit designated by the significant digit signal held in the second holding circuit out of the data signals of multiple digits included in the second identification code matches a data signal of a digit corresponding to the significant digit out of the data signals of multiple digits included in the first identification code held in the first holding circuit, and activates the semiconductor memory device when a match occurs. In this case, only the desired one or more semiconductor memory devices out of the plurality of semiconductor memory devices can be activated and tested by selecting a second identification code and a significant digit signal.

Preferably, a plurality of data input/output terminals are further provided for inputting and outputting of a plurality of data signals. The first holding circuit holds the first identification code provided from outside via the plurality of data input/output terminals in response to a first signal. The second holding circuit holds the significant digit signal provided from outside via the plurality of data input/output terminals in response to a second signal. The determination circuit performs the determination based on the second identification code provided from outside via the plurality of data input/output terminals in response to a third signal, the first identification code held in the first holding circuit, and the significant digit signal held in the second holding circuit. In this case, each of the first identification code, the second identification code, and the significant digit signal is input via the plurality of data input/output terminals so that separate signal input terminals need not be provided for inputting of these signals, whereby the arrangement can be simplified.

According to a further aspect of the present invention, a plurality of semiconductor memory devices are mounted on one test board, and to each semiconductor memory device are provided a first holding circuit for holding a first identification code provided from outside, and a determination circuit for determining whether data signals of multiple digits included in a second identification code provided from outside match data signals of multiple digits included in the first identification code held in the first holding circuit and for activating the semiconductor memory device when a match occurs in a test mode. A specific first identification code is provided to a first holding circuit of each semiconductor memory device. One of the plurality of semiconductor memory devices is selected, and then, a second identification code identical to the first identification code held in the holding circuit of the selected semiconductor memory device is provided to the determination circuit of the selected semiconductor memory device to test the selected semiconductor memory device. Thus, it is possible to activate and to test only the desired semiconductor memory device out of the plurality of semiconductor memory devices so that the excessive rise in the test board temperature can be prevented and the test can be conducted with accuracy.

Preferably, a second holding circuit for holding a significant digit signal provided from outside is further provided to each semiconductor memory device. The determination circuit determines whether a data signal of a significant digit designated by the significant digit signal held in the second holding circuit out of data signals of multiple digits included in a second identification code provided from outside matches the data signal of a digit corresponding to a significant digit out of data signals of multiple digits included in a first identification code held in the first holding circuit, and activates the semiconductor memory device when a match occurs in a test mode. Then, a specific first identification code is provided to the first holding circuit of each semiconductor memory device, and a significant digit signal and a second identification code required for activating the desired one or more semiconductor memory devices are selected. The selected significant digit signal is provided to the second holding circuit of each semiconductor memory device, while the selected second identification code is provided to the determination circuit of each semiconductor memory device, thereby testing the semiconductor memory devices. Consequently, it becomes possible to activate only the desired one or more semiconductor memory devices out of the plurality of semiconductor memory devices so that the excessive rise in the test board temperature can be prevented, allowing the test to be conducted with accuracy. In addition, when employing a test board in which one output power supply of the tester is supplied to the plurality of semiconductor memory devices, the operating current of the desired semiconductor memory device alone can be measured by activating only the desired semiconductor memory device.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a diagram related to the description of a testing method for the DRAM shown in FIG. 4.

FIGS. 7A, to 7E are timing charts related to the description of the testing method for the DRAM shown in FIG. 4.

DESCRIPTION OF THE PREFERRED EMBODIMENTS

First Embodiment

Figure 1:
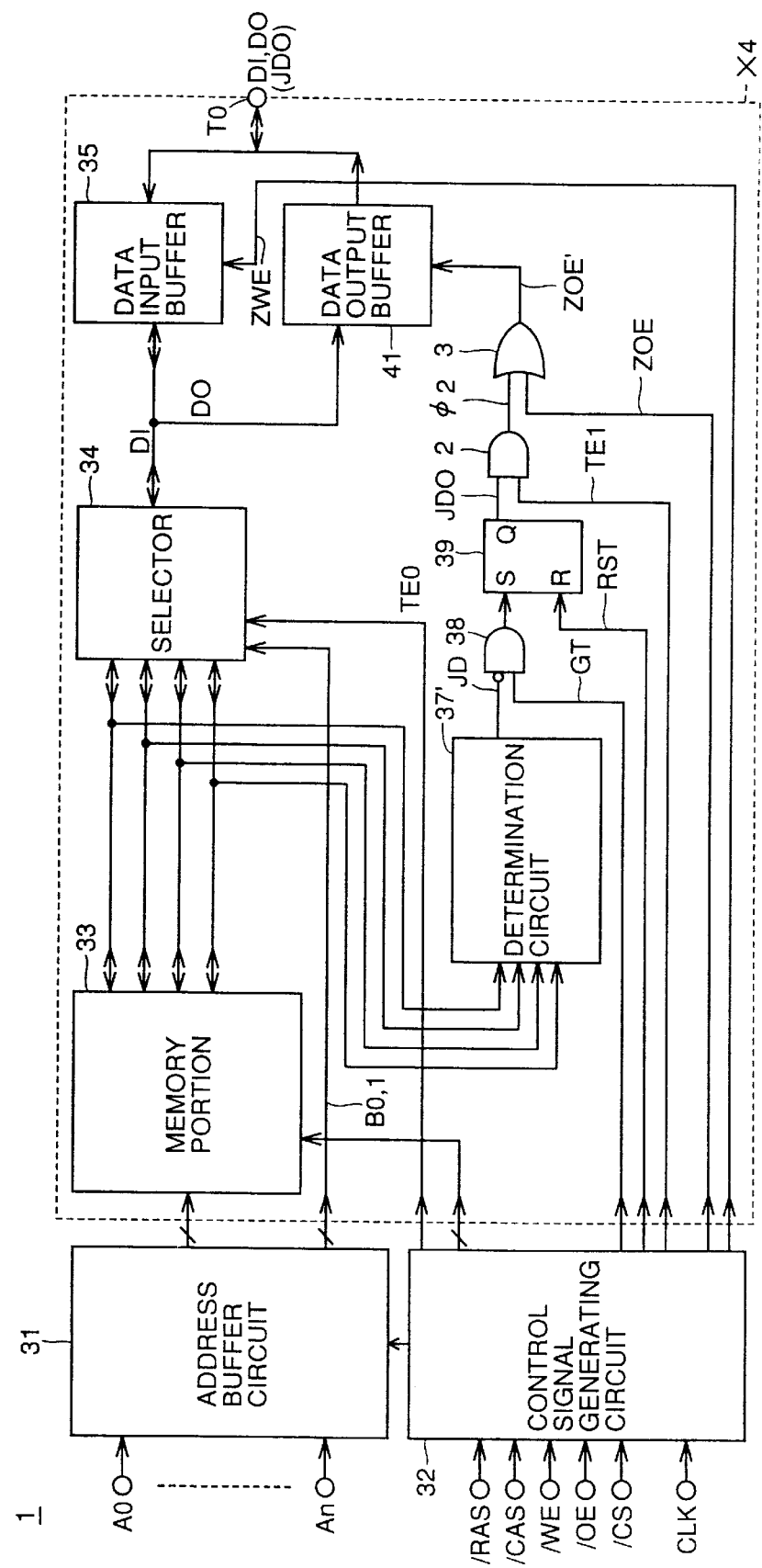
FIG. 1 is a circuit block diagram representing the arrangement of a DRAM according to a first embodiment of the present invention.
Figure 9:
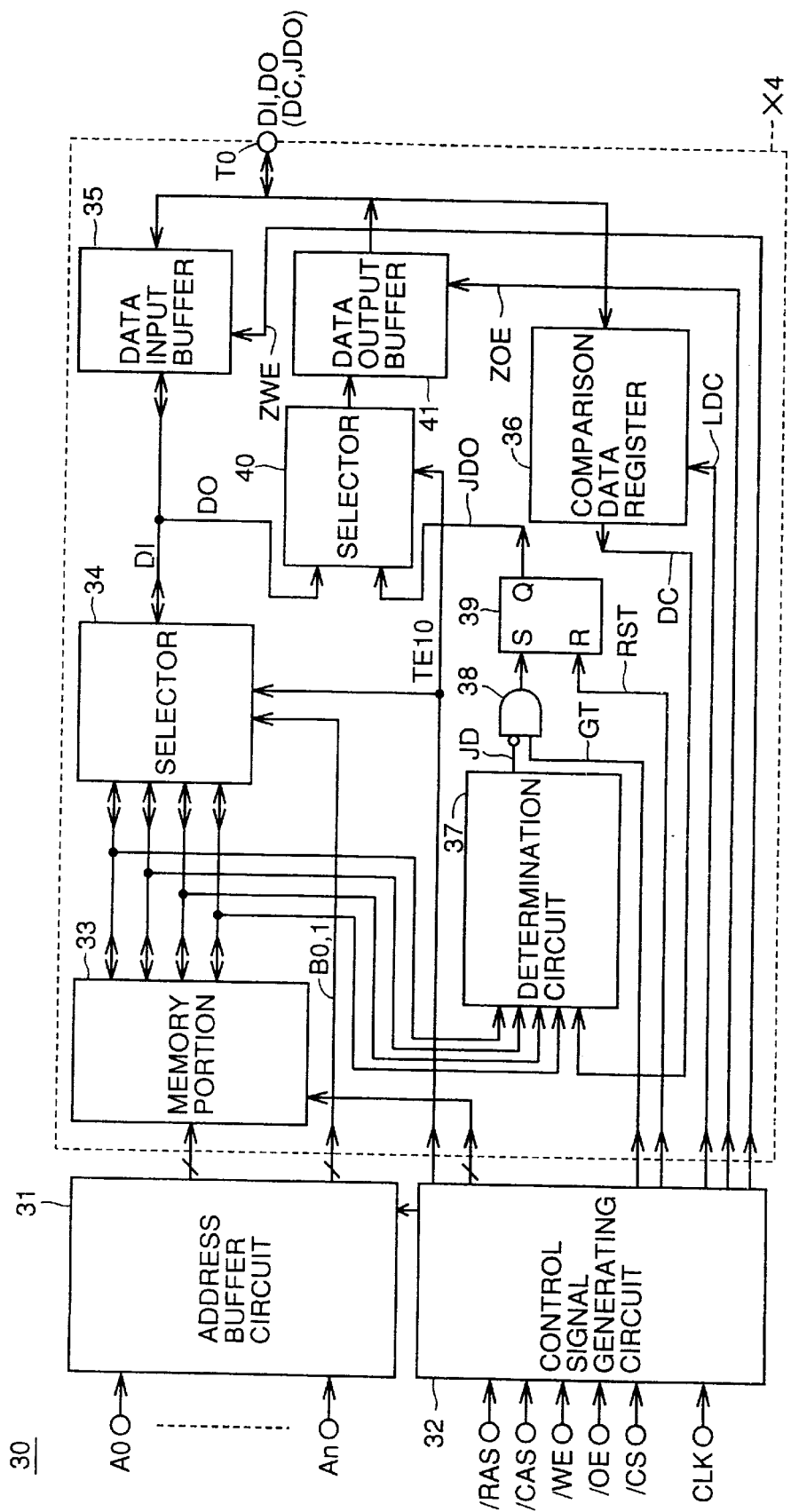
FIG. 9 is a circuit block diagram representing the arrangement of a conventional DRAM.
Figure 10:
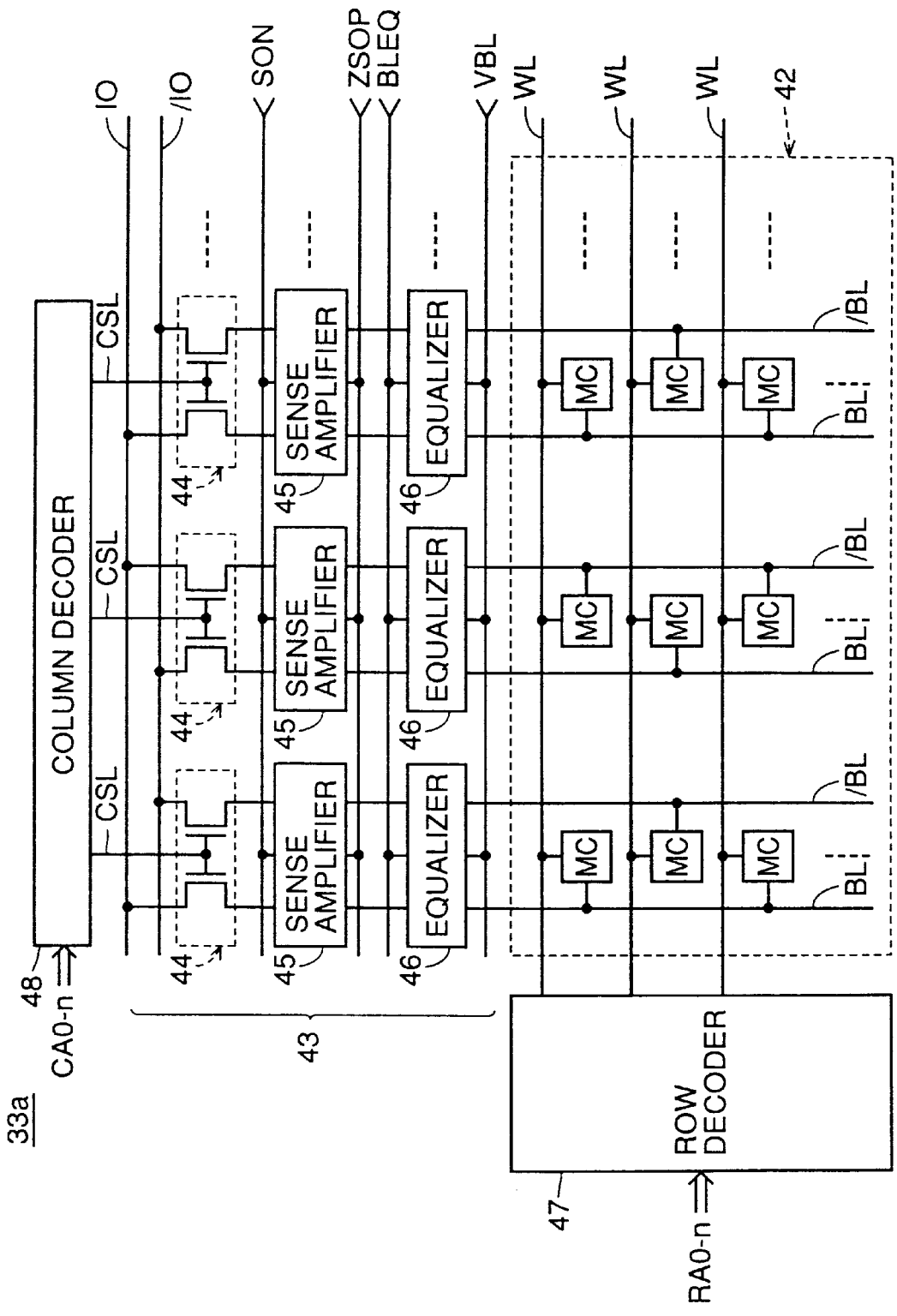
FIG. 10 is a circuit block diagram representing the arrangement of a memory block included in a memory portion shown in FIG. 9.
Figure 11:
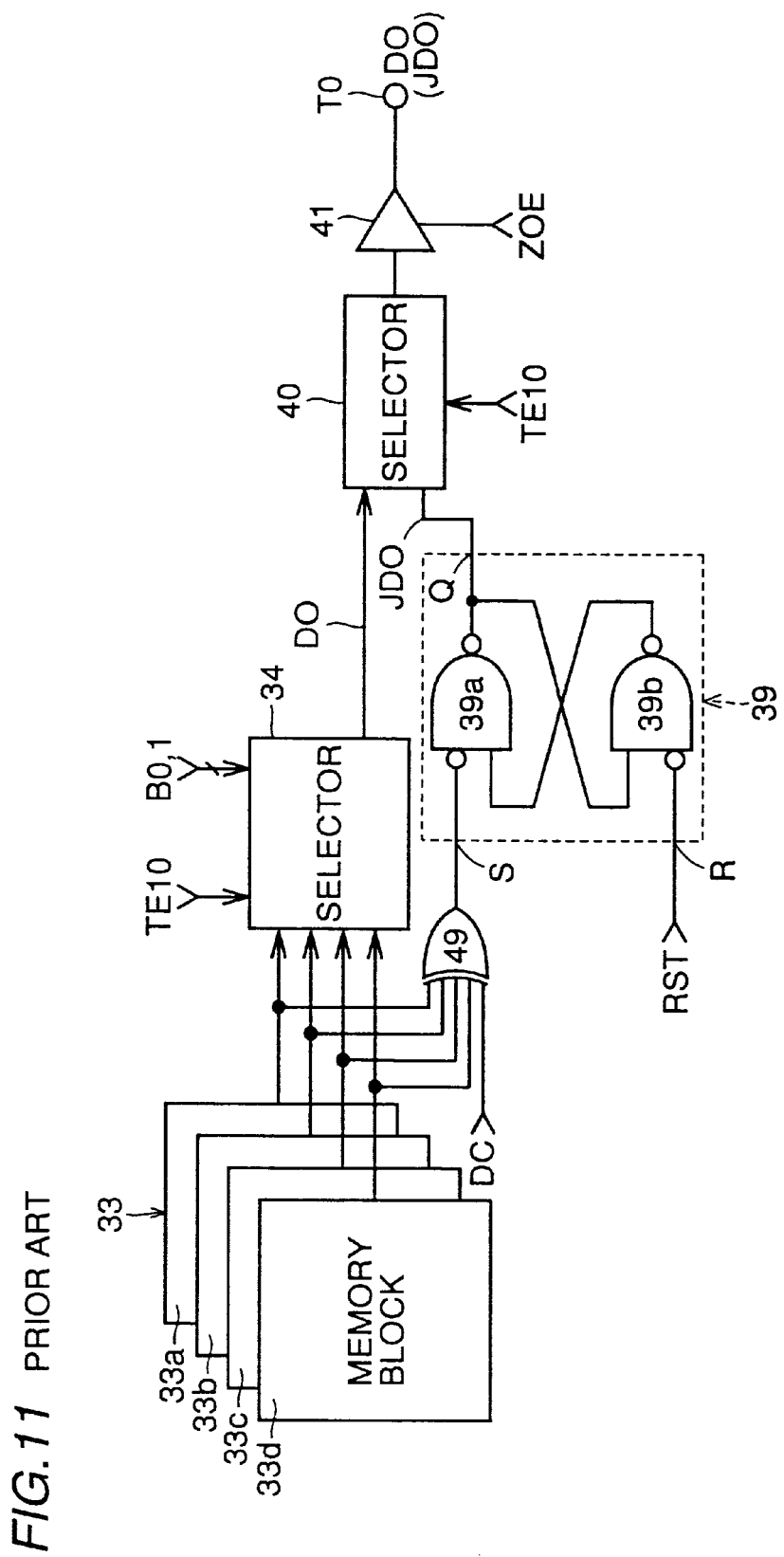
FIG. 11 is a circuit block diagram representing a main portion of the DRAM shown in FIG. 9.
Figure 12:
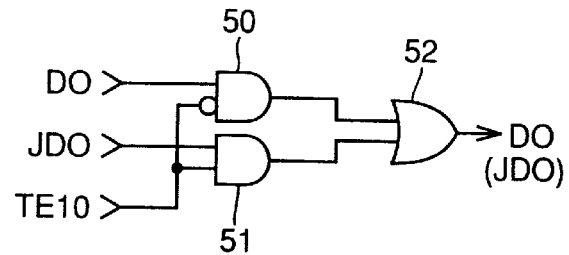
FIG. 12 is a circuit diagram representing the arrangement of a selector 40 shown in FIG. 9.
Figure 13:
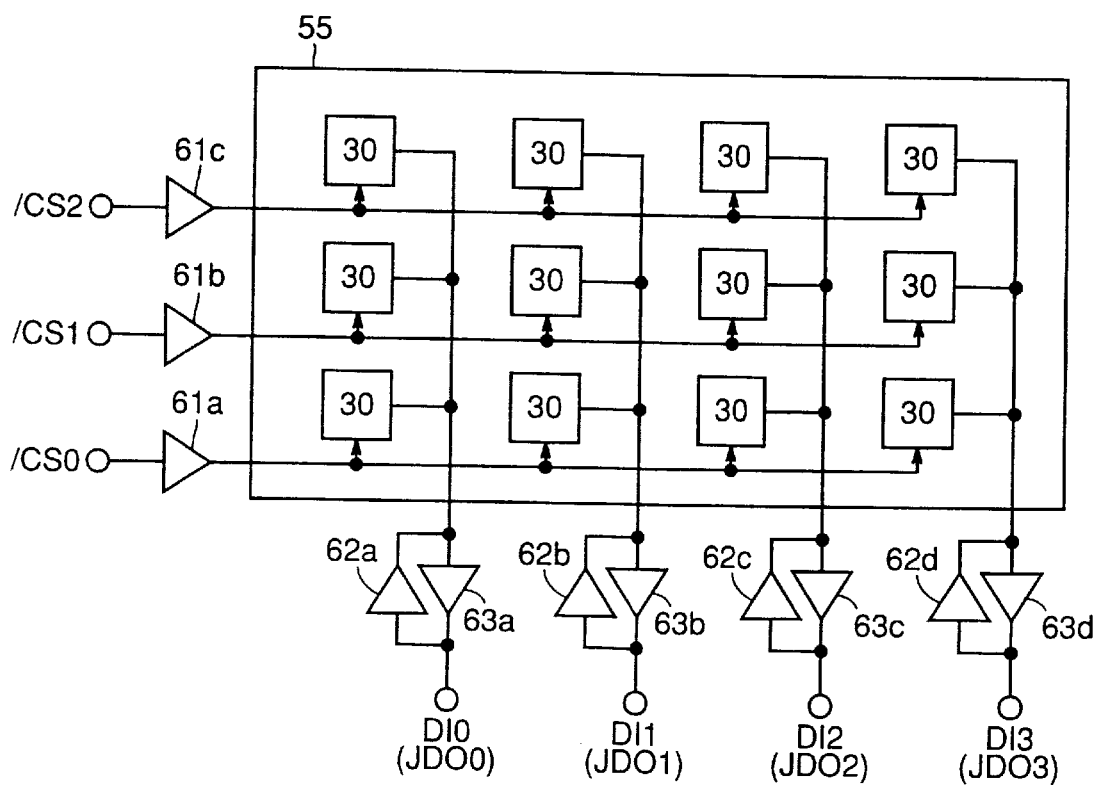
FIG. 13 is a block diagram related to the description of a testing method for the DRAM shown in FIG. 9.

FIG. 1 is a circuit block diagram representing the arrangement of a DRAM according to the first embodiment of the present invention, and is compared with FIG. 9. A DRAM 1 of FIG. 1 differs from DRAM 30 of FIG. 9 in that comparison data register 36 and selector 40 are eliminated, that determination circuit 37 is replaced by a determination circuit 37', that an AND gate 2 and an OR gate 3 are additionally provided, and that test signals TE0 and TE1 are introduced instead of test signal TE10.

Selector 34 provides write data DI to each of four memory blocks 33a to 33d when test signal TE0 is at the active level or the "H" level. Selector 34 selects one of four memory blocks 33a to 33d according to block selecting signals B0 and B1 when test signal TE0 is at the inactive level or the "L" level, and provides read data DO from the selected memory block to data output buffer 41 during a read operation and provides write data DI to the selected memory block during a write operation. Test signal TE0 attains the inactive level or the "L" level during a normal operation and during a read operation in a test, and attains the active level or "H" level during a write operation in a test.

Figure 2:
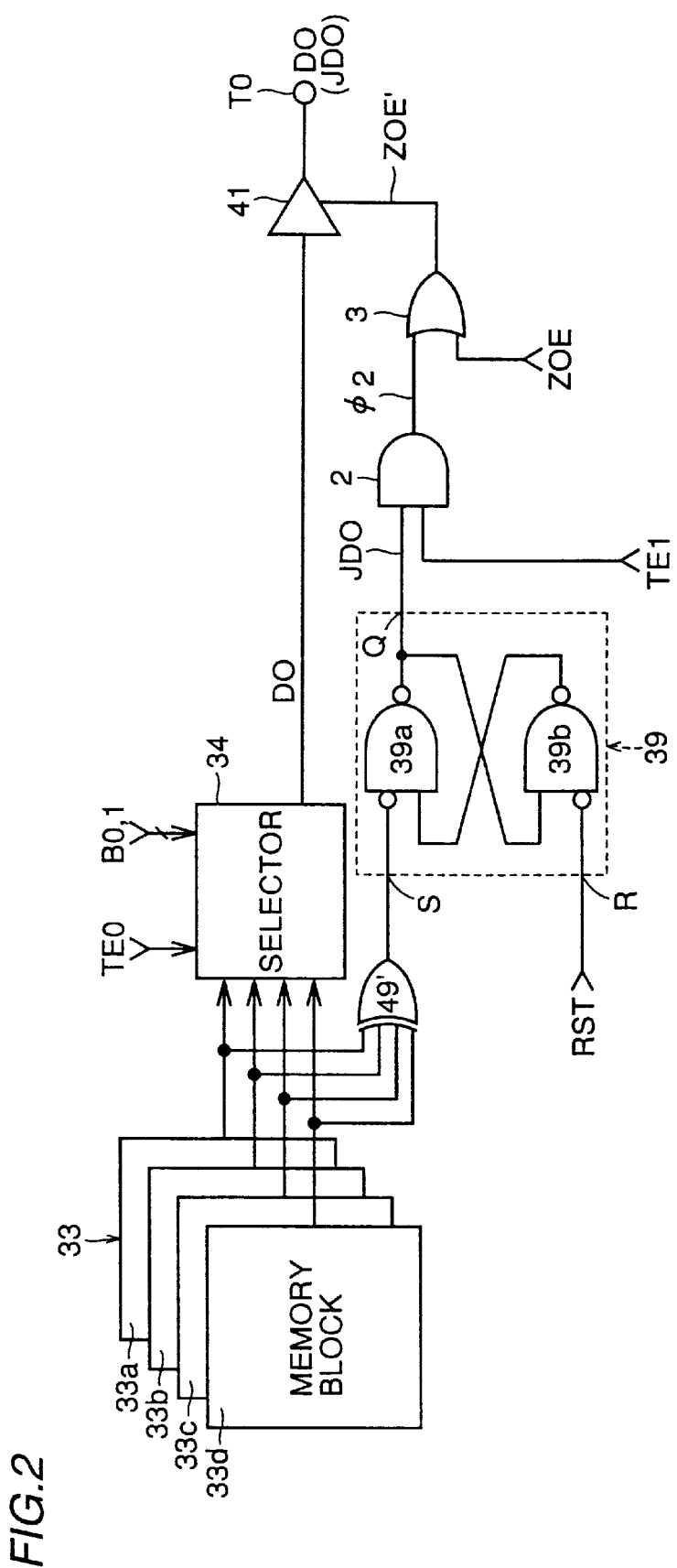
FIG. 2 is a circuit block diagram representing a main portion of the DRAM shown in FIG. 1.

Determination circuit 37' causes determination signal JD to attain the "H" level when four bits of data read out from memory portion 33 match, and causes determination signal JD to attain the "L" level when the four bits of data do not match. When gate signal GT is at the active level or the "H" level, determination circuit 37' and gate circuit 38 are indicated by 4-input EX-OR gate 49', as shown in FIG. 2.

AND gate 2 receives a determination signal JDO and test signal TE1. Test signal TE1 attains the inactive level or the "L" level during a normal operation and during a write operation in a test, and attains the active level or the "H" level during a read operation in a test. OR gate 3 receives an output signal φ2 from AND gate 2 and an output enable signal ZOE, and provides an output signal ZOE' to data output buffer 41.

Now, the operation of DRAM 1 shown in FIGS. 1 and 2 will be described. During a normal operation, test signals TE0 and TE1 are both brought to the inactive level or the "L" level. Output signal φ2 from AND gate 2 is fixed to the "L" level, and output enable signal ZOE passes through OR gate 3 and is input into data output buffer 41. Thus, DRAM 1 operates in the same manner as DRAM 30 of FIG. 9 during the normal operation.

Therefore, during a normal write operation, one of four memory blocks 33a to 33d is selected, and write data DI provided from outside is provided to the selected memory block via data input buffer 35 and selector 34, and is written into a memory cell MC of the address designated by address signals A0 to An within that memory block. Moreover, during a normal read operation, data is read out from a memory cell MC of the address designated by address signals A0 to An in each of four memory blocks 33a to 33d, and one of four memory blocks 33a to 33d is selected and read data DO from that selected memory block is output to the outside via selector 34 and data output buffer 41.

During a write operation in a test, test signals TE0 and TE1 are respectively brought to the "H" level and the "L" level. Write data DI provided from outside is provided to each of four memory blocks 33a to 33d via data input buffer 35 and selector 34, and is written into a memory cell MC of the address designated by address signals A0 to An within each memory block. Thus, the same data is written into four memory cells MC at the same time. In addition, output signal φ2 from AND gate 2 is fixed to the "L" level.

During a read operation in a test, test signals TE0 and TE1 are respectively brought to the "L" level and the "H" level. In addition, a reset signal RST is brought to the "H" level in a pulsed manner, resetting determination result register 39 and bringing signal JDO to the "L" level.

First, in each of four memory blocks 33a to 33d, data is read from memory cell MC of the address designated by address signals A0 to An. One of the four bits of data read out from four memory blocks 33a to 33d is selected by selector 34, and the selected read data DO is provided to data output buffer 41 via selector 34.

On the other hand, four bits of data read out from four memory blocks 33a to 33d are provided to determination circuit 37'. Determination signal JD attains the "H" level when the logic levels of four bits of data match, and attains the "L" level when they do not match. Thereafter, signal GT attains the active level or the "H" level, and signal JD is inverted and is provided to set terminal S of determination result register 39. Output signal JDO from register 39 and output signal φ2 from AND gate 2 attain the "L" level when the above four bits of data match, and attain the "H" level when they do not match.

Then, output enable signal ZOE attains the active level or the "L" level. Output signal ZOE' from OR gate 3 attains the active level or the "L" level when four bits of data match, and maintains the "H" level when they do not match.

Therefore, when four memory cells MC from which data are read are normal, data of the same logic level as the data written in advance is output to the outside (tester) via data output buffer 41 and data input/output terminal T0.

On the other hand, when one of the four memory cells MC from which data are read is defective and the logic levels of four bits of data read out from four memory cells MC do not match, output enable signal ZOE' remains at the "H" level so that data input/output terminal T0 remains in the high impedance state.

When four memory cells MC are all defective and the data having the inverted level of the logic level of the write data is read out from each of four memory cells MC, the data having the inverted level of the logic level of the write data is output to the outside (tester) via data output buffer 41 and data input/output terminal T0.

Thus, the tester can determine the normalcy of four memory cells MC by detecting the state of data input/output terminal T0 of DRAM 1.

In the first embodiment, selector 40 is eliminated so that read data DO is prevented from being delayed by selector 40, and a higher access speed can be achieved. In addition, comparison data register 36 is eliminated so that the load capacitance of data input/output terminal T0 can be reduced, and the higher access speed can be achieved.

Second Embodiment

Figure 3:
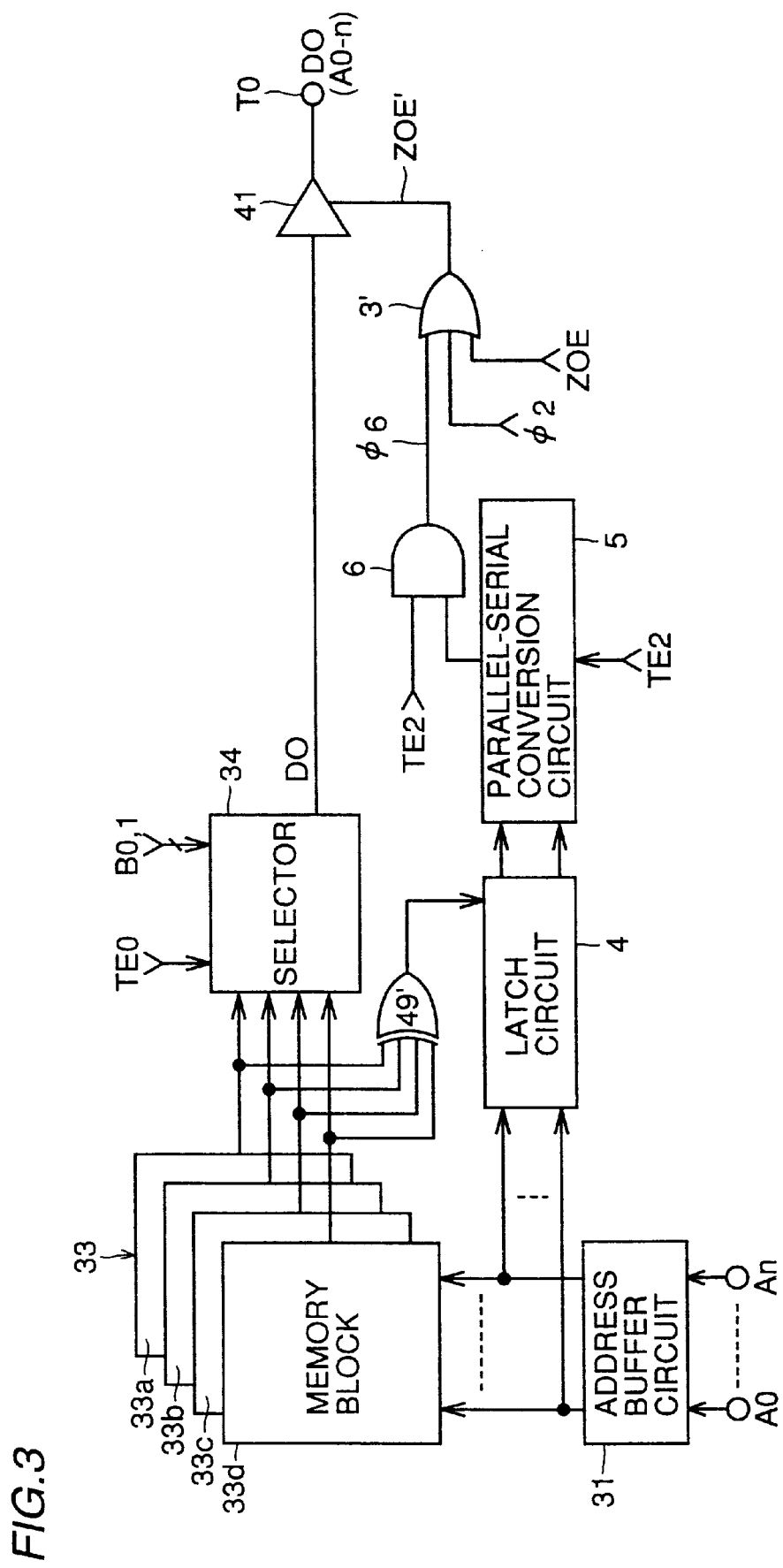
FIG. 3 is a circuit block diagram representing a main portion of a DRAM according to a second embodiment of the present invention.

FIG. 3 is a circuit block diagram representing a main portion of a DRAM according to the second embodiment of the present invention, and is compared with FIG. 2. The DRAM of FIG. 3 differs from the DRAM shown in FIGS. 1 and 2 in that a latch circuit 4, a parallel-serial conversion circuit 5, and an AND gate 6 are additionally provided, that 2-input OR gate 3 is replaced by 3-input OR gate 3', and that a test signal TE2 is introduced.

Latch circuit 4, during a read operation in a test, latches output address signals A0 to An from address buffer circuit 31 according to an output signal from an EX-OR gate 49' attaining the "H" level due to the four bits of data read out from four memory blocks 33a to 33d not matching.

Parallel-serial conversion circuit 5 converts address signals A0 to An latched into latch circuit 4 into a serial signal and successively outputs address signals A0 to An included in the serial signal, one at a time, in a prescribed cycle according to test signal TE2 attaining the active level or the "H" level. Test signal TE2 is brought to the active level or the "H" level when reading address signals A0 to An indicating an address of a defective memory cell MC, and is otherwise brought to the inactive level or the "L" level.

AND gate 6 receives test signal TE2 and an output signal from parallel-serial conversion circuit 5. OR gate 3' receives an output signal φ6 from AND gate 6, output signal φ2 from AND gate 2 shown in FIG. 2, and output enable signal ZOE, and provides an output signal ZOE' to data output buffer 41.

During a normal read operation, test signals TE1 and TE2 are brought to the inactive level or the "L" level, and signals φ2 and φ6 are fixed to the "L" level. Thus, output enable signal ZOE passes through OR gate 3' and is input into data output buffer 41.

When reading address signals A0 to An indicating the address of a defective memory cell MC during or after a test, test signals TE0 and TE1 are brought to the inactive level or the "L" level, and test signal TE2 is brought to the active level or the "H" level, while at the same time, arbitrary address signals A0 to An is input.

When an output address signal from parallel-serial conversion circuit 5 is at the "H" level (1), signals φ6 and ZOE' attain the "H" level, and data input/output terminal T0 enters the high impedance state.

Moreover, when the output address signal from parallel-serial conversion circuit 5 is at the "L" level (0), signal φ6 attains the "L" level, and output enable signal ZOE passes through OR gate 3' and is input into data output buffer 41, and read data DO from selector 34 is output to the outside via data output buffer 41.

Thus, address signals A0 to An indicating the address of a defective memory cell MC can be read out by detecting the state of data input/output terminal T0.

Third Embodiment

Figure 4:
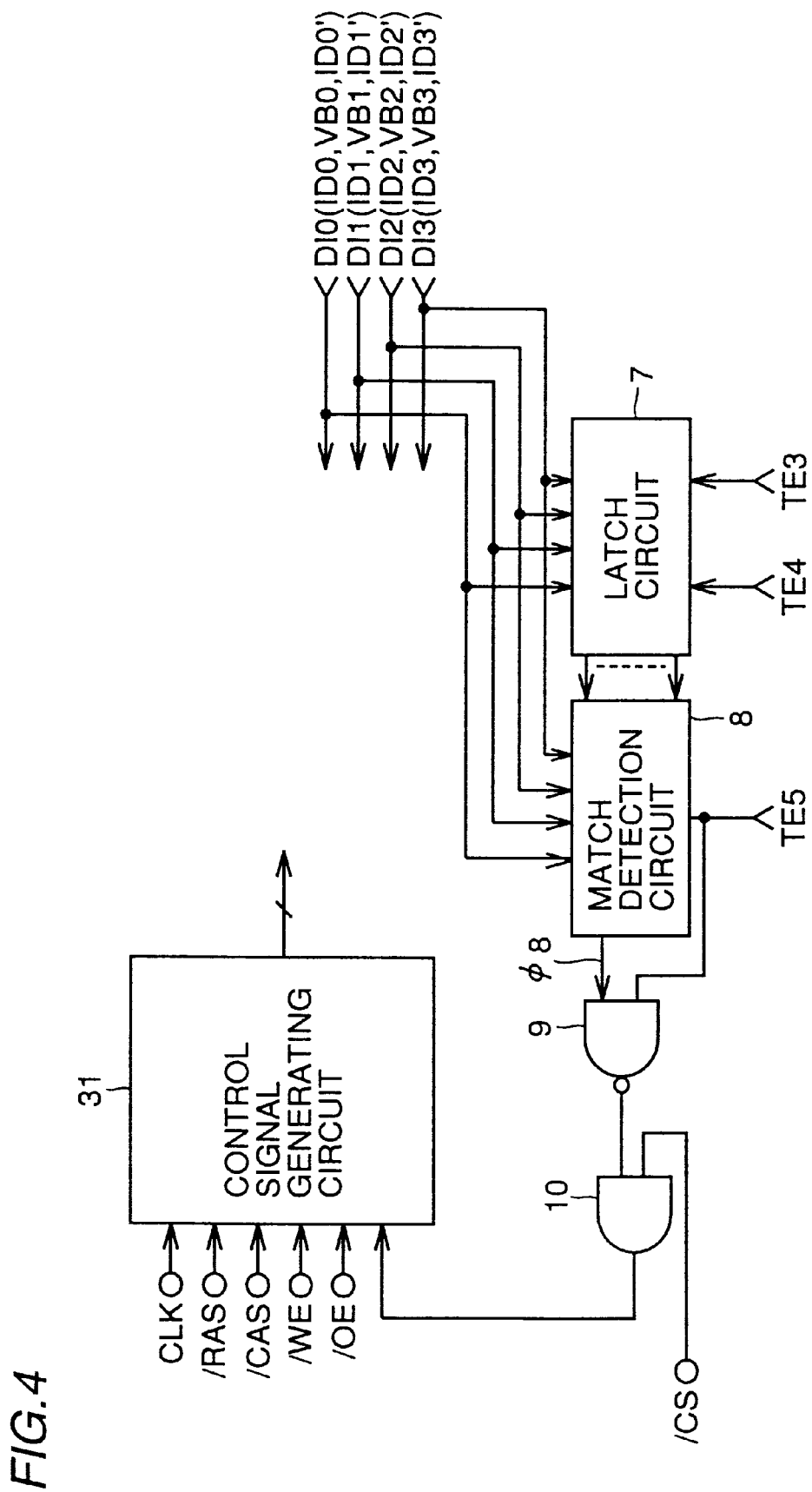
FIG. 4 is a circuit block diagram representing a main portion of a DRAM according to a third embodiment of the present invention.

FIG. 4 is a circuit block diagram representing a main portion of a DRAM according to the third embodiment of the present invention. As shown in FIG. 4, the DRAM according to the third embodiment differs from conventional DRAM 30 shown in FIGS. 9 to 13 in that a latch circuit 7, a match detection circuit 8, an NAND gate 9, and an AND gate 10 are additionally provided, and that test signals TE3 to TE5 are introduced. In the DRAM of FIG. 4, four of the portion enclosed by the dotted lines in FIG. 9 are provided, and four bits of data can be input or output at the same time. During a normal write operation, four bits of write data DI0 to DI3 are provided from outside. ID number data ID0 to ID3 and ID0' to ID3' and valid bit data VB0 to VB3 are provided in place of write data DI0 to DI3 when setting the number of DRAMs to be tested at the same time.

Latch circuit 7 latches ID number data ID0 to ID3 according to test signal TE3 attaining the active level or the "H" level. ID number data ID0 to ID3 are assigned in advance to the DRAM.

In addition, latch circuit 7 latches valid bit data VB0 to VB3 according to test signal TE4 attaining the active level or the "H" level. Each of valid bit data VB0 to VB3 attains the "H" level (1) when the corresponding one of ID number data ID0' to ID3' is valid, and attains the "L" level (0) when the latter is invalid. ID number data ID0 to ID3 and valid bit data VB0 to VB3 latched into latch circuit 7 are provided to match detection circuit 8.

Figure 5:
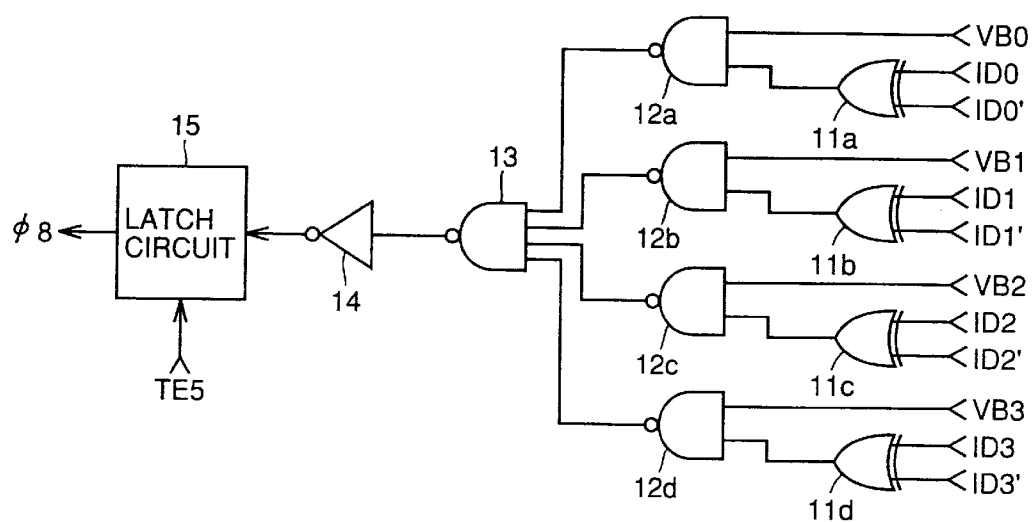
FIG. 5 is a circuit block diagram representing the arrangement of a match detection circuit shown in FIG. 4.

Match detection circuit 8 includes EX-OR gates 11a to 11d, NAND gates 12a to 12d and 13, an inverter 14, and a latch circuit 15, as shown in FIG. 5. ID number data ID0 to ID3 latched into latch circuit 7 are each input into one of the input nodes of the respective EX-OR gates 11a to 11d. ID number data ID0' to ID3' provided from outside are each input into the other of the input nodes of the respective EX-OR gates 11a to 11d. Output signals from EX-OR gates 11a to 11d are each input into one of the input nodes of the respective NAND gates 12a to 12d. Valid bit data VB0 to VB3 latched into latch circuit 7 are each input into the other of the input nodes of the respective NAND gates 12a to 12d.

NAND gate 13 receives output signals from NAND gates 12a to 12d, and provides an output signal via inverter 14 to latch circuit 15. Latch circuit 15 latches an output signal from inverter 14 according to test signal TE5 attaining the active level or the "H" level. A signal latched into latch circuit 15 becomes an output signal φ8 of match detection circuit 8.

NAND gate 9 receives output signal φ8 from match detection circuit 8 and test signal TE5. AND gate 10 receives an output signal from NAND gate 9 and an external control signal /CS, and provides an output signal to control signal generating circuit 31.

Now, the operation of the DRAM will be described. During a normal operation, test signals TE3 to TE5 all attain the "L" level, and the output signal from NAND gate 9 is fixed to the "H" level, and external control signal /CS is input unchanged into control signal generating circuit 31. Thus, the DRAM of the third embodiment operates in the same manner as the conventional DRAM 30 during a normal operation.

As shown in FIG. 6, during a test, a plurality of DRAMs 21 are mounted on one burn-in test board 20 arranged in a matrix of a plurality of rows (fourteen rows in the figure) and a plurality of columns (ten columns in the figure). As described with reference to FIG. 13, a driver for inputting of a control signal ICS is provided corresponding to each row, drivers for inputting of address signals, drivers for inputting of control signals /RAS, /CAS, /WE, and /OE, and a driver for inputting of a clock signal CLK are provided in common to all DRAMs 21. For simplicity, the drivers are not shown in the drawing.

In the initial state, test signals TE3 to TE5 are at the inactive level or the "L" level. First, DRAMs 21 of the first row are activated, and ID number data ID3 to ID0=0000 are input while test signal TE3 is raised to the "H" level, and ID number data 0000 are latched into each latch circuit 7 of DRAMs 21 of the first row. Similarly, ID number data 0001 to 1110 are respectively latched into latch circuits 7 of DRAMs 21 of the second to fourteenth row.

Then, all the DRAMs 21 on test board 20 are activated, and valid bit data VB3 to VB0 (for instance, 0001) are input while test signal TE4 is raised to the "H" level so that valid bit data VB3 to VB0=0001 are latched into latch circuit 7 in every DRAM 21.

Thereafter, all DRAMs 21 on test board 20 are activated, and ID number data ID3' to ID0' (for instance, 1011) are input, while test signal TE5 is raised to the "H" level so that an output signal from inverter 14 is latched into latch circuit 15. Moreover, valid bit data VB0 to VB3 and ID number data ID3' to ID0' are input in synchronism with clock signal CLK and are latched in response to a rising edge of clock signal CLK, as shown in FIGS. 7A to 7E.

Output signal φ8 from latch circuit 15 attains the "H" level when ID number data ID0' of a bit designated by valid bit data VB3 to VB0 is identical to ID number data ID0, and otherwise attains the "L" level. When signal 48 attains the "H" level, an output signal from NAND gate 9 attains the "L" level, and a DRAM 21 is activated regardless of external control signal ICS. When signal φ8 attains the "L" level, the output signal from NAND gate 9 attains the "H" level, allowing DRAM 21 to be activated/inactivated by external control signal /CS. Thus, in this case, DRAMs 21 in the even-numbered rows (the shadowed DRAMs 21) are activated, and the data write/read operations are performed only in the activated DRAMs 21.

Figure 8:
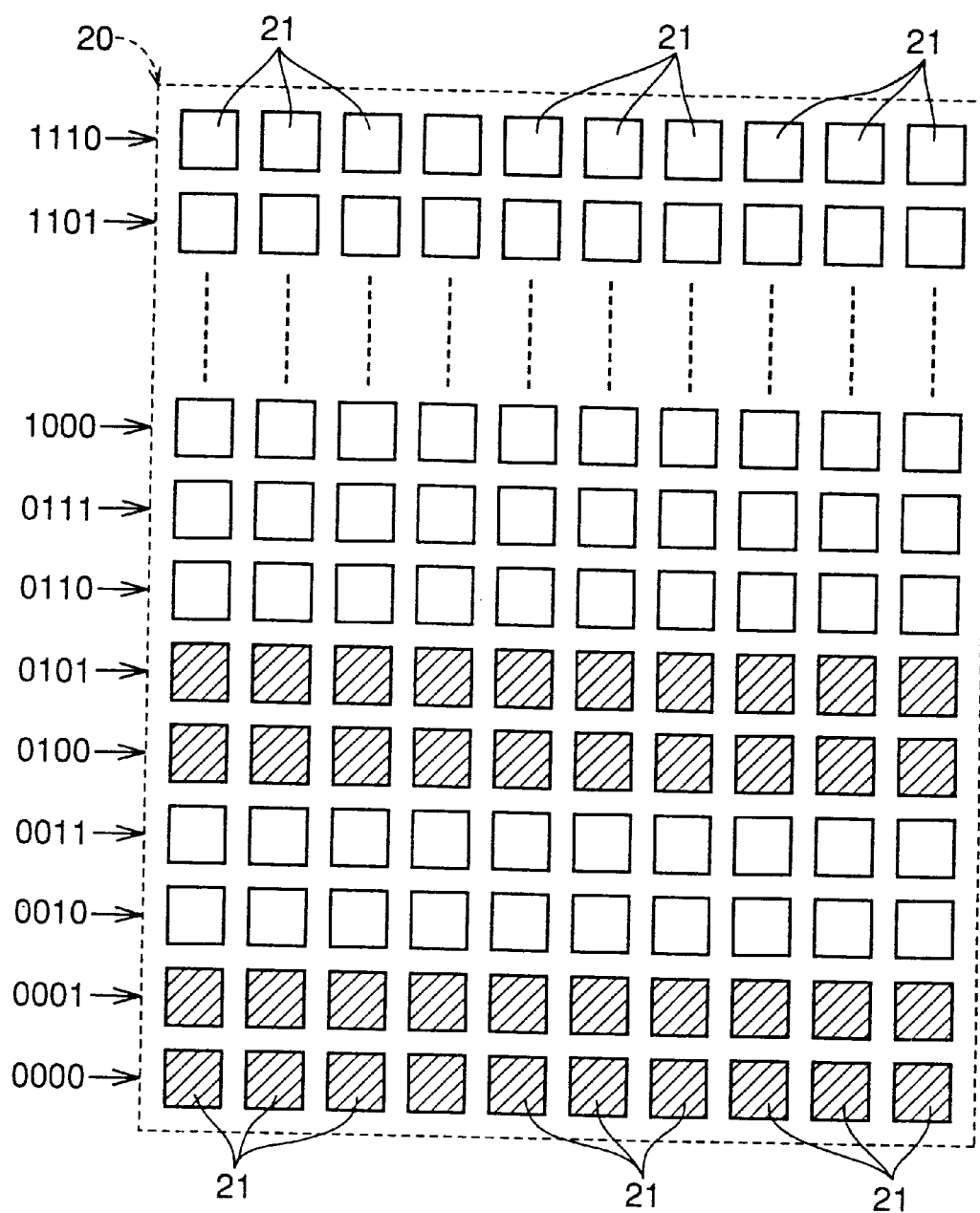
FIG. 8 is another diagram related to the description of the testing method for the DRAM shown in FIG. 4.

In addition, when valid bit data VB3 to VB0=1010 and ID number data ID3' to ID0'=0100, DRAMs 21 of the rows having ID number data ID3 and ID1 that are both "0" s (DRAMs 21 of the shadowed rows in FIG. 8) are activated, and the data write/read operations are performed only in the activated DRAMs 21.

In the third embodiment, it is possible to select only a portion of the plurality of DRAMs 21 mounted on test board 20 to perform the data write/read operations so that the rise in the temperature of test board 20 exceeding the maximum tolerable value and the increase in the consumed current during a test exceeding the maximum tolerable value of the power-supply current for a tester due too many DRAMs 21 with which the data write/read operations are performed at the same time can be prevented, thereby allowing the test to be conducted with accuracy.

Moreover, one DRAM 21 alone of a plurality of DRAMs 21 on test board 20 can be activated by assigning a specific ID number data to each DRAM 21 on test board 20 (for instance, by providing sixteen DRAMs 21 arranged in a matrix of four rows and four columns on test board 20 and assigning 0000 to 1111 respectively to the sixteen DRAMs 21). In this manner, for instance, the operating current of each DRAM 21 on test board 20 can be individually measured.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a test mode in which same data is written at the same time into selected N (N is an integer that is at least two) memory cells and in which said N memory cells are determined as being normal when logics of N bits of data read out at the same time from said N memory cells all match, comprising:

N memory arrays, each including a plurality of memory cells;

a write/read circuit provided corresponding to each memory array for selecting one of a plurality of memory cells belonging to a corresponding memory array according to an address signal and for performing a data write/read operation for the selected memory cell;

a selecting circuit for selecting one memory array out of said N memory arrays according to a block selecting signal;

a data output buffer for outputting to a data input/output terminal a signal of a level corresponding to a logic of data read by said write/read circuit from the memory array selected by said selecting circuit during a period in which an output enable signal is input and for causing said data input/output terminal to enter a high impedance state during a period in which the output enable signal is not input;

a determination circuit for determining whether logics of N bits of data read by said write/read circuit from said N memory arrays all match and for outputting a signal of a first level when a match occurs and for outputting a signal of a second level when no match occurs;

a first holding circuit for holding an output signal of said determination circuit;

a signal generating circuit for outputting the output enable signal according to an external control signal; and a gate circuit provided between said signal generating circuit and said data output buffer for allowing the output enable signal output from said signal generating circuit to be input into said data output buffer during a normal operation and when said first holding circuit holds the signal of the first level during said test mode, and for inhibiting the output enable signal output from said signal generating circuit from being input into said data output buffer when said first holding circuit holds the signal of the second level during said test mode.

2. The semiconductor memory device according to claim 1, wherein said selecting circuit selects one memory array out of said N memory arrays according to said block selecting signal during said normal operation and during a read operation in said test mode and selects each of said N memory arrays during a write operation in said test mode, said semiconductor memory device further comprising:

a data input buffer for transmitting, in response to a write enable signal, external data to the memory array selected by said selecting circuit.

3. The semiconductor memory device according to claim 1, further having a defective address output mode for outputting an address signal for designating a defective memory cell, and further comprising:

a second holding circuit for holding a plurality of data signals included in said address signal in response to outputting of the signal of the second level from said determination circuit; and a read circuit for successively reading, one at a time, the plurality of data signals held in said second holding circuit during said defective address output mode, wherein said gate circuit further allows the output enable signal output from said signal generating circuit to be input into said data output buffer when a data signal read by said read circuit has a first logic, and inhibits the output enable signal output from said signal generating circuit from being input into said data output buffer when a data signal read by said read circuit has a second logic.

4. A semiconductor memory device having a test mode, comprising:

a first holding circuit for holding a first identification code, provided from outside, having data signals of multiple digits for identifying said semiconductor memory device; and a determination circuit for determining whether data signals of multiple digits included in a second identification code provided from outside match data signals of multiple digits included in the first identification code held in said first holding circuit and for activating said semiconductor memory device when a match occurs in said test mode.

5. The semiconductor memory device according to claim 4, further comprising a second holding circuit for holding a significant digit signal, provided from outside, having data signals of multiple digits for designating a significant digit of said second identification code, wherein said determination circuit determines whether a data signal of a significant digit designated by the significant digit signal held in said second holding circuit out of data signals of multiple digits included in said second identification code matches a data signal of a digit corresponding to the significant digit out of said data signals of multiple digits included in the first identification code held in said first holding circuit, and activates said semiconductor memory device when a match occurs.

6. The semiconductor memory device according to claim 5, further comprising:

a plurality of data input/output terminals for inputting/outputting a plurality of data signals, wherein said first holding circuit holds the first identification code provided from outside via said plurality of data input/output terminals in response to a first signal, said second holding circuit holds the significant digit signal provided from outside via said plurality of data input/output terminals in response to a second signal, and said determination circuit performs a determination based on the second identification code provided from outside via said plurality of data input/output terminals, on the first identification code held in said first holding circuit, and on the significant digit signal held in said second holding circuit, in response to a third signal.

7. A semiconductor testing method for testing each semiconductor memory device of a plurality of semiconductor memory devices mounted on one test board, comprising the steps of:

providing, to each semiconductor memory device,
- a first holding circuit for holding a first identification code, provided from outside, having data signals of multiple digits for identifying said semiconductor memory device, and
- a determination circuit for determining whether data signals of multiple digits included in a second identification code input from outside match data signals of multiple digits included in the first identification code held in said first holding circuit and for activating said semiconductor memory device when a match occurs;

providing a specific first identification code to the first holding circuit of each semiconductor memory device; and selecting one of said plurality of semiconductor memory devices and providing a second identification code identical to the first identification code held in the first holding circuit of the selected semiconductor memory device to the determination circuit of the selected semiconductor memory device in order to test the selected semiconductor memory device.

8. The semiconductor testing method according to claim 7, further comprising the steps of:

providing a second holding circuit for holding a significant digit signal, provided from outside, having data signals of multiple digits for designating a significant digit of said second identification code, wherein said determination circuit determines whether a data signal of a significant digit designated by the significant digit signal held in said second holding circuit out of data signals of multiple digits included in said second identification code matches a data signal of a digit corresponding to the significant digit out of data signals of multiple digits included in the first identification code held in said first holding circuit, and activates said semiconductor memory device when a match occurs, said semiconductor testing method further comprising the steps of:

providing a specific first identification code to the first holding circuit of each semiconductor memory device; and selecting at least one semiconductor memory device out of said plurality of semiconductor memory devices, selecting the significant digit signal and the second identification code required for activating the selected at least one semiconductor memory device, and providing the selected significant digit signal to the second holding circuit of each semiconductor memory device, while providing the selected second identification code to the determination circuit of each semiconductor memory device in order to test the selected at least one semiconductor memory device.

9. A method for testing a plurality of semiconductor memory devices, comprising the steps of:

assigning a first identification code to each of the plurality of semiconductor memory devices;

generating a second identification code;

generating a significant digit signal for designating at least one significant digit in said second identification code; and activating semiconductor memory devices having said first identification code containing digits matching said at least one significant digit in said second identification code according to a predetermined rule.

10. The method of claim 9, wherein said predetermined rule requires that said first identification code contains identical digits to said at least one significant digit in said second identification code.

11. A method for testing semiconductor memory devices, comprising the steps of:

mounting a plurality of semiconductor memory devices on a test board;

generating test data;

activating less than all of said plurality of semiconductor memory devices; and writing said test data into the semiconductor memory devices activated in the activating step;

wherein the activating step comprising the steps of:
- assigning a first identification code to each of the plurality of semiconductor memory devices; generating a second identification code;
- generating a significant digit signal for designating at least one significant digit in said second identification code; and
- activating semiconductor memory devices having said first identification code containing digits matching said at least one significant digit in said second identification code according to a predetermined rule.

* * * * *